(12) United States Patent
Kim et al.

(10) Patent No.: US 7,723,820 B2
(45) Date of Patent: May 25, 2010

(54) TRANSISTOR BASED ANTIFUSE WITH INTEGRATED HEATING ELEMENT

(75) Inventors: Deok-kee Kim, Bedford Hills, NY (US); Byeongju Park, Plainview, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 11/616,965

(22) Filed: Dec. 28, 2006

(65) Prior Publication Data

US 2008/0157125 A1 Jul. 3, 2008

(51) Int. Cl.
*H01L 29/00* (2006.01)
(52) U.S. Cl. ............... 257/530; 257/528; 257/E27.081; 257/E29.123; 365/185
(58) Field of Classification Search ............... 257/50, 257/528, 530, E27.081, E29.123; 365/185
See application file for complete search history.

(56) References Cited

U.S. PATENT DOCUMENTS

| | | | |
|---|---|---|---|
| 4,914,055 | A | 4/1990 | Gordon et al. |
| 5,272,666 | A | 12/1993 | Tsang et al. |
| 5,412,593 | A | 5/1995 | Magel et al. |
| 5,621,691 | A | 4/1997 | Park |
| 5,903,041 | A | 5/1999 | La Fleur et al. |
| 6,096,580 | A | 8/2000 | Iyer et al. |
| 6,307,490 | B1 * | 10/2001 | Litfin et al. ............... 341/121 |
| 6,323,534 | B1 | 11/2001 | Marr et al. |
| 6,346,846 | B1 | 2/2002 | Bertin et al. |
| 6,351,425 | B1 * | 2/2002 | Porter |

(Continued)

FOREIGN PATENT DOCUMENTS

WO WO 2004/100271 A1 11/2004

(Continued)

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.

(Continued)

*Primary Examiner*—Cuong Q Nguyen
*Assistant Examiner*—Cathy N Lam
(74) *Attorney, Agent, or Firm*—Scully, Scott, Murphy & Presser, P.C.; Joseph P. Abate, Esq.

(57) ABSTRACT

The present invention provides structures for an integrated antifuse that incorporates an integrated sensing transistor with an integrated heater. Two terminals connected to the upper plate allow the heating of the upper plate, accelerating the breakdown of the antifuse dielectric at a lower bias voltage. Part of the upper plate also serves as the gate of the integrated sensing transistor. The antifuse dielectric serves as the gate dielectric of the integrated transistor. The lower plate comprises a channel, a drain, and a source of a transistor. While intact, the integrated sensing transistor allows a passage of transistor current through the drain. When programmed, the antifuse dielectric, which is the gate of the integrated transistor, is subjected to a gate breakdown, shorting the gate to the channel and resulting in a decreased drain current. The integrated antifuse structure can also be wired in an array to provide a compact OTP memory array.

8 Claims, 4 Drawing Sheets

U.S. PATENT DOCUMENTS

| | | |
|---|---|---|
| 6,388,305 B1 | 5/2002 | Bertin et al. |
| 6,396,120 B1 | 5/2002 | Bertin et al. |
| 6,396,121 B1 | 5/2002 | Bertin et al. |
| 6,433,404 B1 | 8/2002 | Iyer et al. |
| 6,498,056 B1 | 12/2002 | Motsiff et al. |
| 6,512,284 B2 | 1/2003 | Schulte et al. |
| 6,570,207 B2 | 5/2003 | Hsu et al. |
| 6,577,156 B2 | 6/2003 | Anand et al. |
| 6,617,914 B1 | 9/2003 | Kothandaraman |
| 6,621,324 B2 | 9/2003 | Fifield et al. |
| 6,624,031 B2 | 9/2003 | Abadeer et al. |
| 6,624,499 B2 | 9/2003 | Kothandaraman et al. |
| 6,661,330 B1 | 12/2003 | Young |
| 6,750,530 B1 | 6/2004 | Klaasen et al. |
| 6,751,137 B2 | 6/2004 | Park et al. |
| 6,753,590 B2 | 6/2004 | Fifield et al. |
| 6,794,726 B2 | 9/2004 | Radens et al. |
| 6,853,049 B2 | 2/2005 | Herner |
| 6,879,021 B1 | 4/2005 | Fitfield et al. |
| 6,882,027 B2 | 4/2005 | Brintzinger et al. |
| 6,927,997 B2 | 8/2005 | Lee et al. |
| 6,944,054 B2 | 9/2005 | Rueckes et al. |
| 6,972,614 B2 | 12/2005 | Anderson, II et al. |
| 7,087,499 B2 | 8/2006 | Rankin et al. |
| 7,157,782 B1 * | 1/2007 | Shih et al. .................. 257/530 |
| 2004/0004268 A1 | 1/2004 | Brown et al. |
| 2005/0007855 A1 * | 1/2005 | Lee et al. ................. 365/225.7 |
| 2005/0247997 A1 | 11/2005 | Chung et al. |
| 2006/0102982 A1 | 5/2006 | Park et al. |
| 2006/0278932 A1 | 12/2006 | Kothandaraman et al. |

FOREIGN PATENT DOCUMENTS

WO    WO 2006/028946 A2    3/2006

OTHER PUBLICATIONS

U.S. Appl. No. 11/307,785, entitled, "System and Method for Increasing Reliability of Electrical Fuse Programming", filed Feb. 22, 2006, to Byeongju Park et al.

U.S. Appl. No. 11/161,320, entitled, "Doped Single Crystal Silicon Silicided Efuse", filed Jul. 29, 2005, to William R. Tonti et al.

U.S. Appl. No. 11/266,740, entitled, "Efuse and Methods of Manufacturing the Same", filed Nov. 3, 2005, to William R. Tonti et al.

Adkisson, James W., "Anti-Fuse Structure Optionally Integrated With Guard Ring Structure", U.S. Appl. No. 11/462,070, filed Aug. 3, 2006.

Hsu, Louis C., "Programmable Anti-Fuse Structures, Methods for Fabricating Programmable Anti-Fuse Structures, and Methods of Programming Anti-Fuse Structures", U.S. Appl. No. 11/366,879, filed Mar. 2, 2006.

* cited by examiner

TRANSISTOR BASED ANTIFUSE WITH INTEGRATED HEATING ELEMENT

FIELD OF THE INVENTION

The present invention relates to semiconductor memory devices, and particularly, to semiconductor antifuse structures.

BACKGROUND OF THE INVENTION

Electrical antifuses and fuses are used in the semiconductor industry to store non-erasable information. Once programmed, the programmed state of a fuse or an antifuse does not revert to the original state on its own; that is, the programmed state of the fuse or the antifuse is not reversible. For this reason, electrical fuses and antifuses are called One-Time-Programmable (OTP) memory elements. Thus, fuses and antifuses are conducive to the manufacture of a programmable read only memory (PROM). Programming or lack of programming constitutes one bit of stored information in a fuse or an antifuse. The difference between a fuse and an antifuse is the way the resistance of the memory element is changed during the programming process. A semiconductor fuse has a low initial resistance state that may be changed to a higher resistance state through programming, i.e., through electrical bias conditions applied to the fuse. In contrast, a semiconductor antifuse has a high initial resistance state that may be changed to a low resistance state through programming.

Various methods of implementing an antifuse in a semiconductor structure have been known in the prior art. In general, an antifuse includes one insulating layer sandwiched between two electrically conducting plates. In some cases, the insulating layer is a dielectric layer such as silicon dioxide or silicon nitride. In some other cases, the insulating layer comprises a stack of multiple layers including at least one silicon nitride layer and at least one silicon dioxide layer such as an oxide/nitride/oxide (ONO) stack. In a typical antifuse, the three components of the antifuse, i.e., the first electrically conducting plate, the insulating layer, and the second conducting plate, are built in a vertical stack. By supplying a large voltage difference across the two electrically conducting plates, a dielectric breakdown is induced and a current path between the two electrically conducting plates is formed, whereby the high resistance state of the antifuse changes to a low resistance state. Various materials may be used for each of the two electrically conducting plates. Improvements upon the basic structure are also known in the prior art. In one example, U.S. Pat. No. 6,853,049 utilizes a silicide for one electrically conducting plate and polysilicon for the other electrically conducting plate. In another example, U.S. Pat. No. 6,750,530 provides a mechanism for lowering the antifuse programming voltage by providing a resistive heating element adjacent to, but not in contact with the antifuse.

Incorporation of electrical antifuses or fuses into a semiconductor chip requires an external sensing circuitry located outside an array of OTP memory elements for detecting the status of each of the OTP memory elements, i.e., electrical antifuses or electrical fuses. Typically, such circuitry needs to supply a high enough voltage to differentiate the voltage output from each OTP memory element in an array. However, such a circuit design requires that the supplied voltage does not droop substantially across the array as well as requiring that the sense output voltage from each of the OTP memory elements does not droop significantly beyond the noise margin of the sense circuitry. In addition, typical external sensing circuitry requires transistors of substantial size to deliver a large current through the wiring of the array and to insure sufficient signal development during sensing operations.

Incorporating a sensing mechanism into the antifuse structure can reduce the current and noise margin requirements for the external sensing circuitry. However, adding sensing transistors to each antifuse element typically increases the size of the OTP memory element significantly as exemplified in U.S. Pat. No. 6,927,997 to Lee et al, wherein three transistors are required to constitute one antifuse memory element.

Therefore, an antifuse structure with a compact layout area and a built-in sensing mechanism is desired.

Furthermore, an antifuse structure with a wide built-in sense margin within such a built-in sensing mechanism is also desired.

Also, a general challenge in the incorporation of electrical antifuses into semiconductor chips is a relatively high voltage required to program the dielectric material within an electrical antifuse. This is especially important since semiconductor chips provide only a relatively low supply voltage in many applications such as communication and mobile computing. An electrical antifuse with a low programming voltage is therefore desired.

SUMMARY OF THE INVENTION

The present invention addresses the need for an antifuse structure with a compact layout area and a built-in sensing mechanism by providing an antifuse structure incorporating a sensing transistor as part of the antifuse structure.

Also, the present invention addresses the need for a compact layout and a wide built-in sense margin by providing a simple resistor attached to an electrical antifuse.

Furthermore, the present invention provides a low voltage programming of such an antifuse by providing a heater provided with two terminals, wherein the heater also serves as one plate of the antifuse structure itself and as the gate of a sensing transistor.

According to a first embodiment of the present invention, an integrated antifuse is disclosed. The integrated antifuse comprises:

a semiconductor substrate;

an antifuse dielectric;

a gate conductor located on and adjoining the antifuse dielectric;

a first upper terminal adjoining the gate conductor;

a second upper terminal adjoining the gate conductor and not adjoining the first upper terminal;

a channel located directly underneath and adjoining the antifuse dielectric and located within the semiconductor substrate;

a source adjoining the channel and located within the semiconductor substrate; and a drain adjoining the channel and not adjoining the source and located within the semiconductor substrate, wherein the gate conductor, the antifuse dielectric, the channel, the source, the drain, and the semiconductor substrate form a MOSFET.

Within the structure of the MOSFET, the antifuse dielectric serves the function of a normal gate dielectric. The first terminal and the second terminal are connected to at least two separate voltage supplies. Preferably, a resistor is connected in series between an integrated antifuse and a first voltage supply to provide a compact sensing mechanism.

One aspect of the present invention is that the breakdown of the antifuse dielectric is accelerated by an elevated temperature provided by the current through the gate conductor located on and adjoining the antifuse dielectric. To program the antifuse, the voltage across the antifuse dielectric is made to exceed the breakdown voltage of the antifuse dielectric at the elevated temperature achieved by the heating of the gate conductor.

The application of two different voltages on the two terminals attached to the gate conductor and the ability to control the temperature of the antifuse dielectric through the heating of the gate conductor are additional aspects of the present invention.

The integrated antifuse may operate in a programming mode or in a sensing mode. During the programming mode, a current flows through the gate conductor and raises the temperature of the antifuse dielectric while at the same time, a high voltage differential is applied across the antifuse dielectric.

During the sensing mode, the current through the gate conductor is minimized by minimizing the differences between the voltage applied to the first upper terminal and the voltage applied to the second upper terminal. Preferably, the current through the conductor is eliminated by equalizing the voltage applied to the first upper terminal and the voltage applied to the second upper terminal. At the same time, a voltage differential that exceeds the threshold voltage of the MOSFET, which is integrated into each integrated antifuse, is applied across the antifuse dielectric, which is also a gate dielectric for the MOSFET, to turn on the MOSFET. The voltage differential across the antifuse dielectric is less than the dielectric breakdown voltage for the antifuse dielectric at the operating temperature of the MOSFET, which is typically less than 125° C. in most semiconductor applications.

According to a second embodiment of the present invention, an integrated antifuse array wherein multiple antifuse memory elements are arranged in rows and columns to form an OTP memory array is disclosed. Each of the multiple antifuse memory elements contains an integrated antifuse according to the first embodiment of the present invention and a semiconductor device capable of changing the voltage at the drain of the connected integrated antifuse. Preferably, the semiconductor device is a resistor. For the description of the present invention, a resistor is used for the semiconductor device. While there are many methods of forming such an array, the present invention is described for a particular circuit configuration.

The integrated antifuse array according to the second embodiment of the present invention comprises:

multiple antifuse memory elements arranged in rows and columns, wherein each of the antifuse memory elements in turn contains:
  an integrated antifuse according to the first embodiment of the present invention;
  a resistor that is electrically connected to the drain in a series connection; and
at least two first row wires connecting the first upper terminals of the integrated antifuses located in a same row;
at least two second row wires connecting the second upper terminals of the integrated antifuses located in a same row;
at least two first column wires connecting the resistors in a same column, wherein one end of each resistor connects to a drain and the other end connects to one of the first column wires; and
at least two second column wires connecting the sources in a same column.

The first and second row wires select a row of the integrated antifuse array for the purpose of programming and sensing an integrated antifuse. The first and second column wires select a column of the integrated antifuse array for the purpose of programming and sensing an integrated antifuse. Altering the circuit configuration to exchange the rows and columns are within the knowledge of one of ordinary skill in the art.

DETAILED DESCRIPTION OF THE INVENTION

Figure 1A:
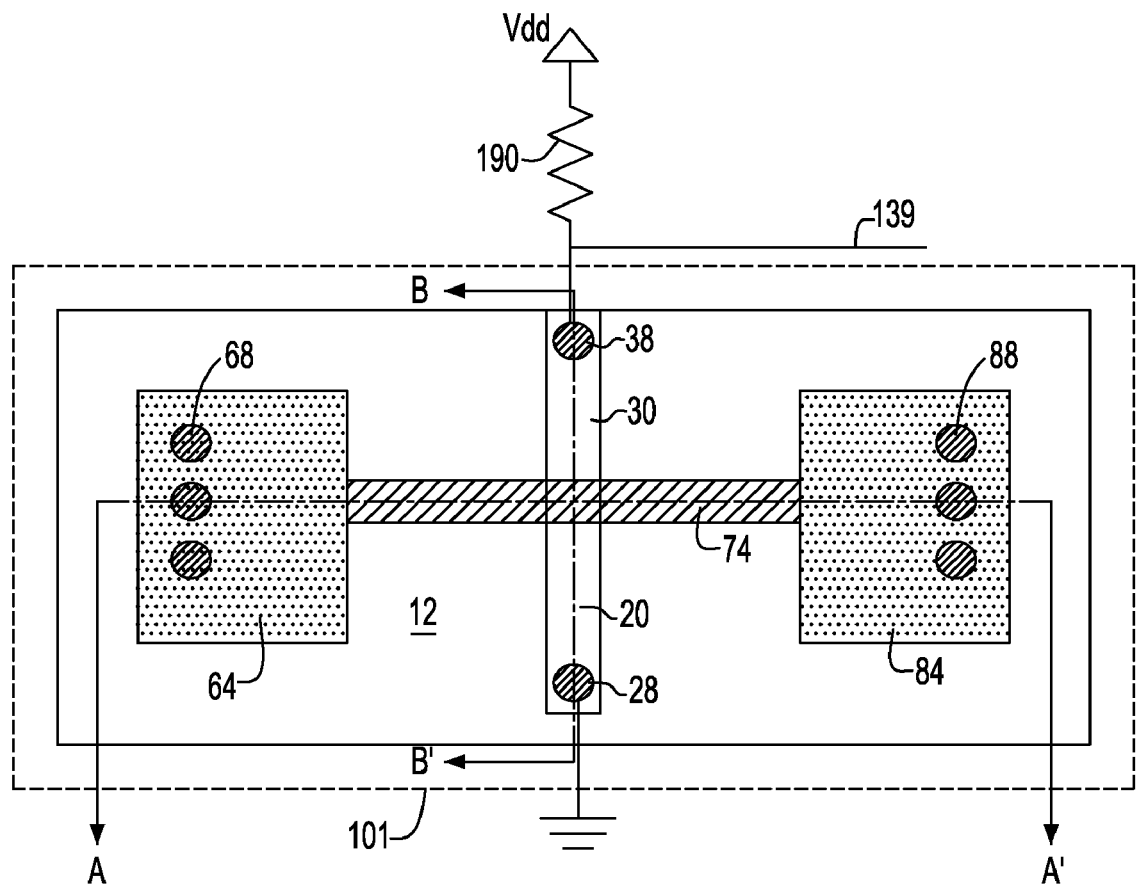
FIG. 1A is a top-down view of an integrated antifuse with a schematic connection to a resistor according to the first embodiment of the present invention.

As stated above, the present invention relates to semiconductor antifuse structures, which structures will now be described in greater detail by referring to the drawings.

Figure 1B:
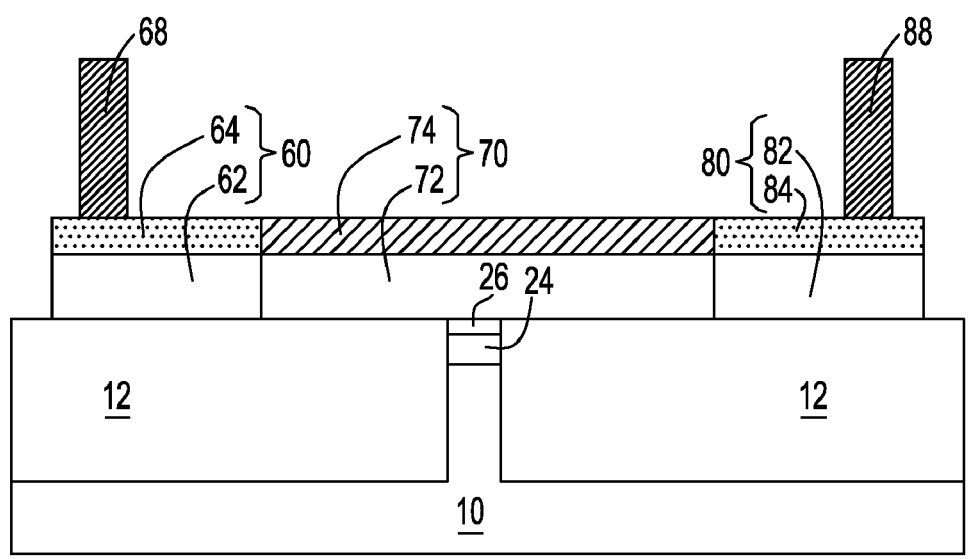
FIG. 1B is a cross-sectional view along the plane A-A' in FIG. 1A of an integrated antifuse according to the first embodiment of the present invention.
Figure 1C:
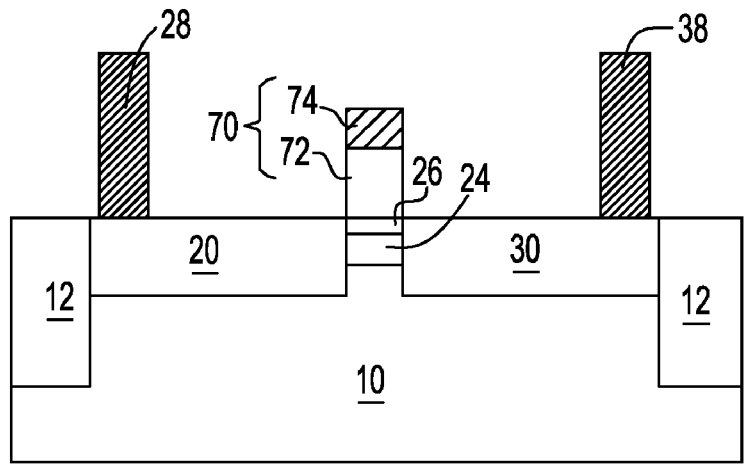
FIG. 1C is a cross-sectional view along the plane B-B' in FIG. 1A of an integrated antifuse according to the first embodiment of the present invention.

FIG. 1A-1C are diagrams illustrating the physical construction of an integrated antifuse. A schematic for a resistor 190 and a connection 139 to a sense node structure (not shown) are also depicted in FIG. 1A. FIG. 1A should be interpreted such that elements 190 and 139 are only schematic representations, while the rest of the elements constitute a top-down view of a physical integrated antifuse 101.

Referring to FIG. 1A-1C, an integrated antifuse 101 according to the first embodiment of the present invention is formed on a semiconductor substrate 10 patterned with shallow trench isolation (STI) 12. A gate dielectric 26 is formed within a semiconductor area surrounded by STI 12 in the same manner as during the formation of a MOSFET. In fact, the integrated antifuse 101 according to the first embodiment of the present invention contains a MOSFET comprising a semiconductor substrate 10, an antifuse dielectric 26, which functions as the gate dielectric in the MOSFET, a gate conductor 70 located on and adjoining the antifuse dielectric 26, a channel 24 located directly underneath and adjoining the antifuse dielectric 26 and located within the semiconductor substrate 10, a source 20 adjoining the channel 24 and located within the semiconductor substrate 10, and a drain 30 adjoining the channel 24 and not adjoining the source 20 and located within the semiconductor substrate 10. The gate conductor, the antifuse dielectric, the channel, the source, the drain, and the semiconductor substrate form a MOSFET. Preferably, the gate conductor 70 further comprises a gate polysilicon 72 and a metal silicide 74.

The integrated antifuse 101 according to the first embodiment of the present invention further comprises a first upper terminal 60 adjoining the gate conductor 70 and a second upper terminal 80 adjoining the gate conductor 70 and not adjoining the first upper terminal 60. The first upper terminal 60, the second upper terminal 80, and the gate conductor 70 together form an upper plate of the integrated antifuse 101. All elements within the upper plate of the integrated antifuse 101 are electrically connected. However, due to the intentional finite resistance of the gate conductor 70, the gate conductor 70 may be heated by passing a current through it. Preferably, the first upper terminal 60 and the second upper terminal 80 are formed on shallow trench isolation (STI) 12 to minimize the heat loss to the semiconductor substrate 10. Preferably, each component of the upper plate, that is, each of the first upper terminal 60, the second upper terminal 80, and the gate conductor 70 comprises a stack of a gate polysilicon and a metal silicide. In FIG. 1B, the first upper terminal 60 comprises a first upper terminal polysilicon 62 and a first upper terminal metal silicide 64. Similarly, the second upper terminal 80 comprises a second upper terminal polysilicon 82 and a second upper terminal metal silicide 84. Preferably, contacts are used on the source 20, on the drain 30, on the first upper terminal 60, and on the second upper terminal 80 to make electrical connections. FIGS. 1A-1C show a source contact 28, a drain contact 38, first upper terminal contacts 68, and second upper terminal contacts 88.

To program the integrated antifuse 101, the antifuse dielectric 26 located between the gate conductor 70 and the channel 24 is subjected to a high voltage differential, while the gate conductor is at the same time heated to an elevated temperature by passing a current through it. The heat generated in the gate conductor 70 in turn raises the temperature of the antifuse dielectric 26, lowering the dielectric breakdown voltage significantly.

Figure 2:
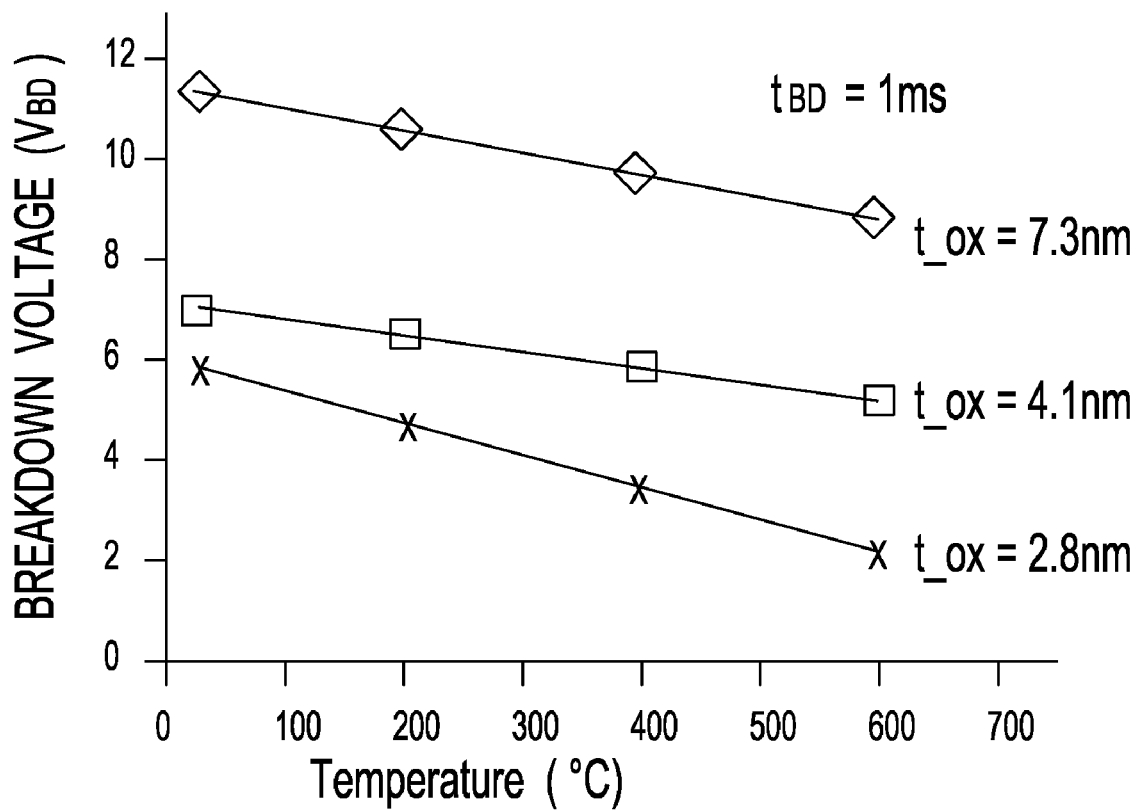
FIG. 2 is a graph showing the decrease of breakdown voltage for a breakdown time of 1 ms for silicon oxide of various thickness with increasing temperature.

The magnitude of the voltage differential required across the antifuse dielectric 26 depends on the temperature of the antifuse dielectric 26, the composition of the antifuse dielectric, the thickness of the antifuse dielectric 26, and the duration of the voltage differential across the antifuse dielectric 26. FIG. 2 shows breakdown voltages, or the magnitude of the voltage differential across the antifuse dielectric that is required to induce a dielectric breakdown within a given time duration of the voltage differential, for silicon oxide of various thickness (7.3 nm, 4.1 nm, and 2.8 nm) and for the voltage differential duration time (pulse time) of 1 ms at various ambient temperatures. The reduction of the dielectric breakdown voltage is significant at elevated temperatures. For a 2.8 nm silicon oxide, the breakdown voltage is reduced from about 6 V at room temperature to about 2 V at 600° C.

An aspect of the first embodiment of the present invention is the temperature acceleration of dielectric breakdown of an antifuse dielectric through the use of heating provided to the upper plate, specifically to the gate conductor 70. The phenomenon, illustrated in FIG. 2, is advantageously utilized to enable a low voltage programming of the integrated antifuse 101 according to the present invention. To enable the generation of heat in the gate conductor 70, two different voltages are provided to the first upper terminal 60 and to the second upper terminal 80 to induce a current through the gate conductor 70. The current passing through the gate conductor 70 then causes Ohmic heating of the gate conductor 70. The heat thus generated raises the temperature of the adjoining antifuse dielectric 26. By subjecting the antifuse dielectric to a voltage differential between the gate conductor 70 and the channel 24, the antifuse dielectric goes through a dielectric breakdown, thus programming the integrated antifuse 101.

According to the first embodiment of the present invention, to induce the antifuse dielectric breakdown with a low voltage differential across the antifuse dielectric, the voltage at the channel of the MOSFET is also controlled such that there is a high enough voltage differential across the antifuse dielectric 26 at the time of programming.

The heating of the antifuse dielectric 26 through the gate conductor 70 is very effective since the gate conductor 70 is in direct contact with the antifuse dielectric 26. For example, simulation has shown that temperatures exceeding 700° C. can readily be obtained in the gate polysilicon with only 6 mW of power generation from a 1.2 micron long and 93 nm wide gate conductor which consists of polysilicon and cobalt silicide with a sheet resistance of about 10 Ohms per square. The temperature of the antifuse dielectric closely approaches the temperature of the gate conductor 70 since only the portion of the gate conductor 70 that overlaps with the channel is in close proximity to a good thermal conductor, i.e., a silicon material or a metal wiring, and both the first upper terminal 60 and the second upper terminal 80 are on STI 12, which is a good thermal insulator.

The explicit representation of the first upper terminal 60 and the second upper terminal 80 is for the sake of clearly describing the present invention. It is not necessary for the first upper terminal 60 or for the second upper terminal to have distinct shape that can be easily differentiated from the gate conductor 70. In practice, the widths of the first upper terminal 60 and the second upper terminal 80 can be identical to the width of the gate conductor 70, so that the entire upper plate can look like one continuous gate line. It is necessary, however that at least two contacts are formed on the upper plate so that current can flow through the gate conductor and the gate conductor can be heated up above the antifuse dielectric 26.

The antifuse dielectric 26 may be any of the material used for gate dielectric provided that dielectric breakdown may be induced by applying a reasonably high voltage across it. Such dielectric material may be silicon oxide, silicon nitride, silicon oxynitride, a high-K dielectric layer or a stack thereof. A dielectric material with a highly accelerated dielectric breakdown at elevated temperatures is preferred. An example of such a material is silicon oxide.

Figure 3:
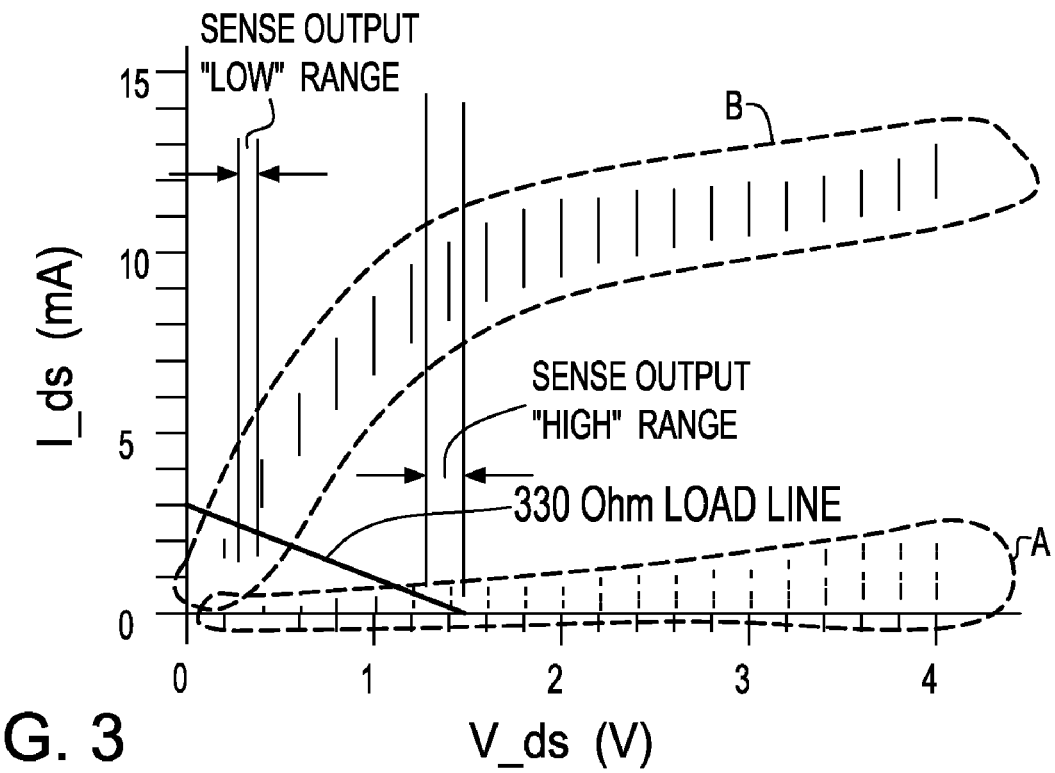
FIG. 3 is a graph of transistor characteristics of a MOSFET with 2.8 nm oxide gate dielectric before dielectric breakdown (B) and after dielectric breakdown (A) along with a simulated circuit load of a 330 Ohm resistor according to the first embodiment of the present invention.

The integrated MOSFET in the integrated antifuse 101 according to the present invention displays two distinct FET characteristics depending on the state of the antifuse dielectric 26. If the antifuse dielectric 26 is intact, the integrated MOSFET displays normal MOSFET characteristics. If the antifuse dielectric 26 goes through a dielectric breakdown, the integrated MOSFET does not have appreciable drain current. Simply put, the programming of the integrated antifuse 101 breaks the MOSFET and renders it non-functional. Results of a test on a 2.8 nm oxide MOSFET wherein the drain current was measured at various drain bias voltages relative to the source and measured over a wide range of gate voltages between 3 V and 5 V are shown in FIG. 3. The MOSFET I-V curve "before" the gate dielectric breakdown is labeled "B" and the MOSFET I-V curve "after" the gate dielectric breakdown is labeled "A" in FIG. 3. The MOSFET after a dielectric breakdown is essentially non-functional and does not pass a substantial amount of current.

According to the first embodiment of the present invention, the drain of the integrated antifuse 101 is further connected to an external resistor, which is in turn connected to a first voltage supply. FIG. 3 also shows operation of an exemplary circuit in which the first voltage supply provides 1.5V and the external resistor is a 330 Ohm resistor, which is typical of a resistor consisting of a gate line with a number of squares of about 33. The voltage at the drain, or the "sense output" may be "high" or "low" depending on the state of the integrated MOSFET. Thus, a very compact sense circuit for the integrated antifuse 101 is also provided according to the first embodiment of the present invention.

For the purposes of description of the present invention, a connection to ground is also considered a connection to a voltage supply, wherein the supplied voltage happens to be 0V. At the time of programming, different voltages are applied to the first and second upper terminals so that a current flows through the gate conductor 70, thereby heating the gate conductor 70 and the underlying antifuse dielectric 24, which is the gate dielectric of the MOSFET structure that is integrated into the integrated antifuse 101 structure.

Preferably, a semiconductor device is connected in series between an integrated antifuse 101 and a first voltage supply, Vdd_1. More preferably, the semiconductor device is capable of changing the voltage at the drain 130 of the integrated antifuse 101 depending on the current, such as a diode or a resistor. Most preferably, the semiconductor device is a resistor 190. The resistor may be a semiconductor resistor built with doped polysilicon, or a silicide resistor, or a metal resistor formed within a back-end-of-the-line wiring level. The purpose of the resistor 190 is to provide a sense output at the node 139 between the integrated antifuse 101 and the resistor 190. While the present invention is described with a resistor 190, one of ordinary skill in the art can replace the resistor 190 with another semiconductor device that is capable of changing the voltage at the node 139 depending on the amount of the current flow.

Figure 4:
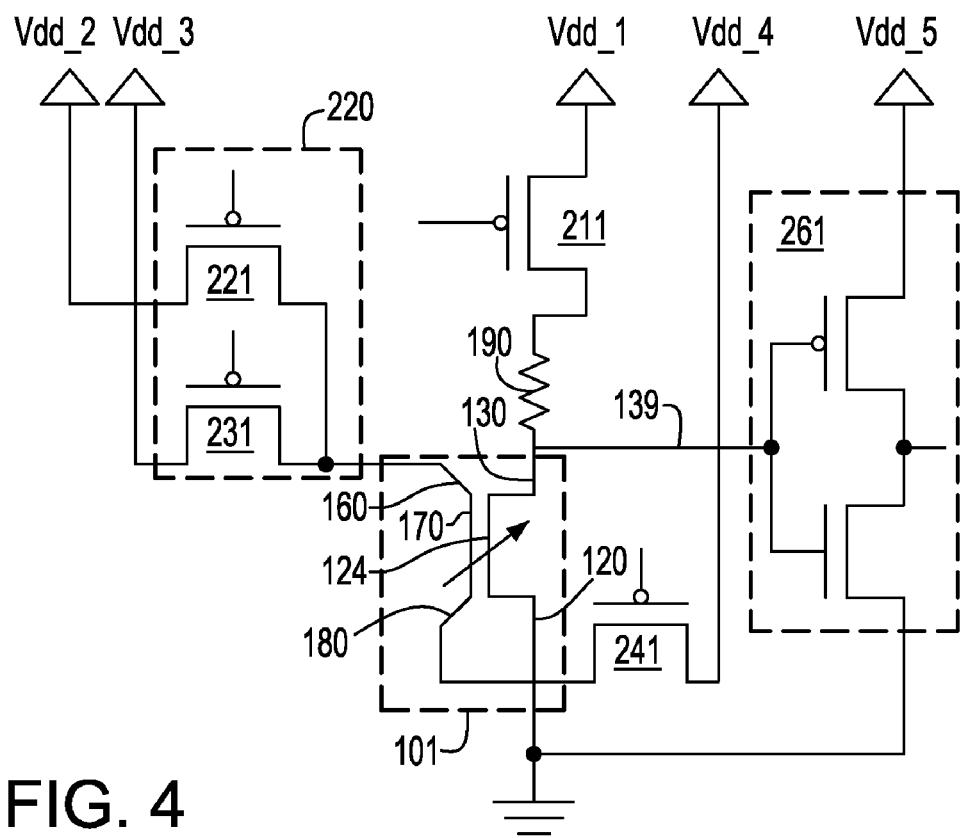
FIG. 4 is a circuit diagram for an integrated antifuse with a peripheral circuitry.

FIG. 4 shows a preferred version of the first embodiment of the present invention in a circuit schematic. Although a constant voltage may be directly supplied from the first voltage supply, Vdd_1 connected to a resistor 190 in a series connection with an integrated antifuse 101, a switching element 211 is preferably inserted between the resistor 190 and the first power supply, Vdd_1 to reduce standby power consumption. Also, a switching element 211 may be utilized to help control the voltage at the channel 124 of the MOSFET within the integrated antifuse 101 to optimize the operation of the integrated antifuse 101. The drain 130 or the node 139 between the integrated antifuse 101 and the resistor 190 produces the sense output. Optionally, a sense node structure 261 is attached to the drain 130 of the integrated antifuse 101. A sense node structure 261 may be a buffer, an inverter, or a level shifter that amplifies or stabilizes the sense output from the node 139 between the integrated antifuse 101 and the resistor 190. A fifth voltage supply, Vdd_5 may be directly tied to the sense node structure 261 since the sensing of the integrated antifuse 101 is independent of programming.

Detailed voltage conditions for sensing and programming may be different depending on the circuit implementation but the following principles are used to determine the voltages applied to the first upper terminal 160, the second upper terminal 180, and to the channel 124:

(a) During the programming mode, the voltage on the first upper terminal 160 and the voltage on the second upper terminal 180 are different to induce a current flow through the gate conductor 170 and to raise the temperature of the gate conductor 170 and the antifuse dielectric to an elevated temperature.

(b) During the programming mode, the voltage differential between the part of the gate conductor 170 located above the channel 124 and the channel 124 exceeds the dielectric breakdown voltage of the antifuse dielectric at the elevated temperature.

(c) During the sensing mode, the voltage differential between the first upper terminal 160 and the voltage on the second upper terminal 180 is minimized or eliminated to prevent an acceleration of dielectric breakdown of the antifuse dielectric.

(d) During the sensing mode, the voltage differential between the part of the gate conductor 170 located above the channel 124 and the channel 124 is set to turn on the MOSFET within the integrated antifuse 101 while not exceeding the dielectric breakdown voltage at the operating temperature of the MOSFET.

In a preferred version of the first embodiment of the present invention, to facilitate the control of the voltage at the gate conductor 170 and the current through the gate conductor 170, the first upper terminal 160 is electrically connected to a second voltage supply, Vdd_2 or a third voltage supply, Vdd_3 through a selectable switching mechanism 220. The second upper terminal 180 is connected to a fourth voltage supply, Vdd_4 through a switching device 241. Preferably, the selectable switching mechanism 220 is a parallel connection of a first MOSFET 221 and a second MOSFET 231, wherein the first MOSFET 221 is connected to the second voltage supply, Vdd_2 in a series connection and the second MOSFET 231 is connected to the third voltage supply, Vdd_3 in a series connection, and the switching device 241 is a third MOSFET. Vdd_2 provides a voltage to the first upper terminal 160 of each integrated antifuse 101 during the programming mode and Vdd_3 provides a voltage to the first upper terminal 160 of each integrated antifuse 101 during the sensing of each integrated antifuse.

Figure 5:
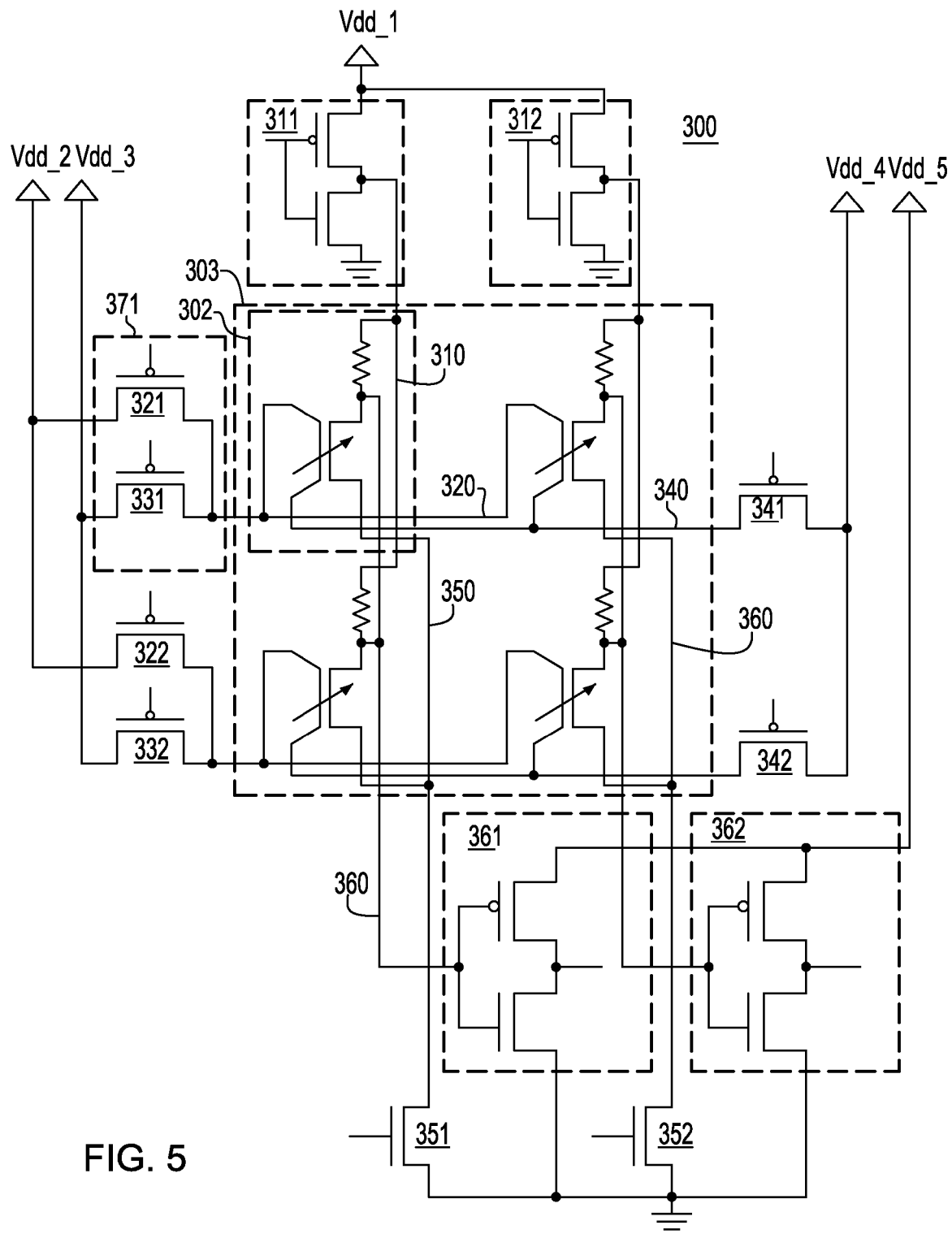
FIG. 5 is a circuit diagram for a 2×2 integrated antifuse array with a peripheral circuitry.

According to the second embodiment of the present invention, an integrated antifuse array 300 as shown in FIG. 5 is disclosed. While FIG. 5 describes a 2×2 integrated antifuse array 300, generalization to an arbitrary m×n array, where both m and n are integers greater than 1, is straightforward and within the knowledge of a person of ordinary skill in the art.

The integrated antifuse array 300 comprises a two dimensional matrix 303 of multiple antifuse memory elements 302 that are arranged in rows and columns. Each of the multiple antifuse memory elements 302 comprises an integrated antifuse 101 according to the first embodiment of the present invention and a semiconductor device that is connected in series with each of the integrated antifuse 101. The semiconductor device induces a change in voltage at the drain 130 of the integrated antifuse 101 depending on the current through it. Most preferably, the semiconductor device is a resistor 190.

Furthermore, the integrated fuse array 300 comprises a wiring system that connects various parts of each of the multiple antifuse memory elements 302 in the two dimensional matrix 303. While there are many methods of wiring such an array to enable the programming of individual integrated antifuses 101, one particular method is disclosed according to the second embodiment of the present invention. One of ordinary skill in the art can make modification for obvious variations in the method of wiring the array.

According to the second embodiment of the present invention, the wiring system in the integrated antifuse array 300 includes:

at least two first row wires 320 connecting the first upper terminals 160 of the integrated antifuses 101 located in a same row;

at least two second row wires 340 connecting the second upper terminals 180 of the integrated antifuses 101 located in a same row;

at least two first column wires 310 connecting the resistors 190 in a same column, wherein one end of each resistor 190 connects to the drain 130 and the other end of each resistor 190 connects to one of the first column wires 310; and at least two second column wires 350 connecting the sources 120 in a same column.

According to the second embodiment of the present invention, resistors 190 in the same column are connected to one of first column wires 310, which in turn is electrically connected to the first power supply, Vdd_1. Preferably, each of the first column wires 310 is connected to a first voltage supply, Vdd_1 through one of first switching elements 311, 312 in a series connection. Preferably, each of the first switching elements 311, 312 is an inverter with a PMOSFET and an NMOSFET in a series connection with a common gate. Connecting each of the first column wires 310 to the first power supply, Vdd_1 through one of the inverters not only enables a selection of a column during programming of the integrated antifuses 101 but also reduces standby power consumption of the integrated antifuse array 300.

As in the first embodiment of the present invention, the application of two different voltages on the gate conductor 170 and the ability to control the temperature of the antifuse dielectric 26 through the heating of the gate conductor 170 within the integrated antifuses 101 in the integrated antifuse array 300 is necessary to enable the second embodiment of the present invention.

According to the second embodiment of the present invention, the control of the temperature of the antifuse dielectric 26 is achieved row by row, that is, all the antifuse dielectrics 26 of the integrated antifuses 101 within the same row are either heated at the same time or remain unheated at the same time. By selecting the first column wire 310 to which the integrated antifuse 101 to be programmed is connected and by applying a proper level of voltage to the selected first column wire 310, the antifuse dielectric 26 is subjected to both an elevated temperature and a voltage differential across the antifuse dielectric 26. Both the elevated temperature and the voltage differential are needed to program an integrated antifuse 101. While all the integrated antifuses 101 connected to the selected first column wire 310 have the necessary voltage condition on the channel 124 of the integrated MOSFET only the integrated antifuse 101 connected to the selected first row wire 320, the selected second row wire 340, and the selected first column wire 310 have both the elevated temperature of the gate conductor 370 and the necessary voltage condition on the channel 124 of the integrated MOSFET to create a large enough voltage differential across the antifuse dielectric 26.

The row selection scheme according to the second embodiment of the present invention selects all the gate conductors 170 connected to the same pair of first row wire 320 and the second row wire 340. However, satisfying the condition of a sufficient voltage differential across the antifuse dielectric is satisfied only in the integrated antifuse 101 that is selected for programming since the voltage conditions of the first column wires 310 are chosen such that the unselected integrated antifuses 101 do not have sufficient voltage differential across the antifuse dielectric 26. Therefore, despite the elevated temperature of the unselected integrated antifuses 101 that are located within the selected row, the lack of voltage differential across the antifuse dielectric 26 prevents the unselected integrated antifuses 101 from being programmed. The integrated antifuses 101 outside the selected row do not heat up and, therefore, are not programmed.

As in the first embodiment of the present invention, each of the first row wires 320, which are connected to the first upper terminals 160 in the same row, are electrically connected to a second voltage supply, Vdd_2 or to a third voltage supply, Vdd_3 through a selectable switching mechanism 371. Similarly, each of the second row wires 340, which are connected to the second upper terminals 180 in the same row, is connected to a fourth voltage supply, Vdd_4 through one of switching devices 341, 342. Preferably, each of the selectable switching mechanism 371, 372 is a parallel connection of a first MOSFET 321, 322 and a second MOSFET 331, 332 wherein the first MOSFET 321 is connected to the second voltage supply, Vdd_2 in a series connection and the second MOSFET 331 is connected to the third voltage supply, Vdd_3 in a series connection, and each of the switching devices 341, 342 is a third MOSFET. Vdd_2 provides a voltage to the first upper terminal 160 of each integrated antifuse 101 during the programming mode and Vdd_3 provides a voltage to the first upper terminal 160 of each integrated antifuse 101 during sensing of each integrated antifuse.

Preferably, instead of grounding the source 120 of all integrated antifuses 101 as described in the first embodiment, second column wires 350 connect the sources 120 of all integrated antifuses 101 located in the same column according to the second embodiment. Each of the second column wires 350 is then connected to ground through one of second switching elements 351, 352 in a series connection. Preferably, each of the second switching elements 351, 352 is a fourth MOSFET.

Preferably, drains 130 in the same column are connected to one of third column wires 360. Optionally, each of the third column wires 360 is also connected to a sense node structure 361, 362. A sense node structure 361, 362 is a device or circuitry that amplifies or stabilizes the sense output signal such as a buffer, an inverter, or a level shifter. A fifth voltage supply, Vdd_5 may be directly tied to the sense node structures 361, 362 since the sensing of the integrated antifuse array is independent of programming.

Preferably, at the time of sensing, a gate voltage high enough to turn on the integrated MOSFET in the integrated antifuse 101 is supplied only to the integrated antifuses 101 in one row by turning on the only one of the selectable switching mechanism 371 is turned on the second MOSFET 331, 332 connected to the selected first row wire 320. Preferably, all of the second switching elements (351, 352) connected to the second column wires 350 are turned on to connect the source 120 of all of the integrated antifuses 101 to ground. Similarly, all of the first switching elements 311, 312 are turned on to connect all of the first column wires 310 to the first power supply Vdd_1. Gates of the integrated MOSFETs in integrated antifuses 101 located in unselected rows are not provided with a bias voltage needed to turn on the integrates MOSFETs. Therefore, the sense signal on each of the third column wire 360 is determined only by the state of the integrated antifuse 101 located in the selected row. All integrated antifuses in the same row may be sensed at the same time.

The principle for sensing each of the integrated antifuses 101 in the integrated antifuse array 300 is identical in the second embodiment as in the first embodiment of the present invention. A MOSFET in a programmed integrated antifuse 101, wherein the antifuse dielectric 26 went through a breakdown, does not turn on due to the shorting of the gate conductor 170 to the channel 124. A MOSFET in an intact integrated antifuse 101, wherein the antifuse dielectric 26 is still intact, turns on and passes current through the resistor 190 and the drain 130. Therefore, the voltage at the drain 130 of each integrated antifuse 101 is different depending on the state of the antifuse dielectric 124.

Sensing of the integrated antifuse array 300 according to the second embodiment of the present invention is performed row by row. Only one row is selected for sensing at a time. All antifuse memory elements in the same row may be sensed at the same time. The entire array may be sensed by sensing the state of the integrated antifuses 101 in one row in one operation and repeating the row sense operation after selecting the next row until the entire array is sensed. As many number of sensing operations as the number of rows is needed to sense the entire array.

Preferably, one of the first row lines 320 is biased to turn on the integrated MOSFETs within the integrated antifuse array 300 to enable a simultaneous sensing of all the integrated antifuses 101 within a selected row. If the antifuse dielectric 26 in an integrated antifuse 101 went through a breakdown, the integrated MOSFET containing such antifuse dielectric 26 will not turn on. The integrated MOSFET turns on only if the antifuse dielectric 26 in the selected integrated antifuses 101 is also intact. The voltage at the drain 130 of each integrated antifuse 101 in the selected row is transmitted to one of the sense node structures 361, 362 attached to the corresponding third column wire 360. Therefore, multiple third column wires 360 can provide multiple parallel sensing of the integrated antifuses 101 connected to the activated first column wire 320. Other circuit considerations such as maximum instantaneous power consumption can limit the number of sensed columns as desired.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising:
   a semiconductor substrate;
   an antifuse dielectric;
   a gate conductor located on and adjoining said antifuse dielectric;
   a first upper terminal adjoining said gate conductor;
   a second upper terminal adjoining said gate conductor and not adjoining said first upper terminal;
   a channel located directly underneath and adjoining said antifuse dielectric and located within said semiconductor substrate; and
   a source adjoining said channel and located within said semiconductor substrate; and
   a drain adjoining said channel and not adjoining said source and located within said semiconductor substrate, wherein said gate conductor, said antifuse dielectric, said channel, said source, said drain, and said semiconductor substrate form a MOSFET, wherein said first upper terminal is electrically connected to a second voltage supply or a third voltage supply through a selectable switching mechanism and said second upper terminal is connected to a fourth voltage supply through a switching device.

2. The semiconductor structure of claim 1, wherein said selectable switching mechanism is a parallel connection of a first MOSFET and a second MOSFET, wherein said first MOSFET is connected to said second voltage supply in a series connection and said second MOSFET is connected to said third voltage supply in a series connection, and said switching device is a third MOSFET.

3. A semiconductor structure comprising:
   multiple antifuse memory elements arranged in rows and columns, wherein each of said antifuse memory elements includes:
   a semiconductor substrate;
   an antifuse dielectric;
   a gate conductor located on and adjoining said antifuse dielectric;
   a first upper terminal adjoining said gate conductor;
   a second upper terminal adjoining said gate conductor and not adjoining said first upper terminal;
   a channel located directly underneath and adjoining said antifuse dielectric and located within said semiconductor substrate;
   a source adjoining said channel and located within said semiconductor substrate;
   a drain adjoining said channel and not adjoining said source and located within said semiconductor substrate, wherein said gate conductor, said antifuse dielectric, said channel, said source, said drain, and said semiconductor substrate form a MOSFET;
   a resistor that is electrically connected to said drain in a series connection;
   at least two first row wires connecting said first upper terminals of said antifuse memory elements located in a same row;
   at least two second row wires connecting said second upper terminals of said antifuse memory elements located in a same row;
   at least two first column wires connecting said resistors in a same column, wherein one end of each of said resistors connects to said drain and the other end of each of said resistors connects to one of said at least two first column wires; and
   at least two second column wires connecting said sources in a same column.

4. The semiconductor structure of claim 3, wherein each of said at least two first column wires is connected to a first voltage supply through a first switching element in a series connection.

5. The semiconductor structure of claim 3, wherein each of said at least two second column wires is connected to ground through a second switching element in a series connection.

6. The semiconductor structure of claim 3, further comprising at least two third column wires, wherein said drains in a same column are connected to one of said at least two third column wires, and each of said third column wire is connected to a sense node structure.

7. The semiconductor structure of claim 4, wherein each of said at least two first row wires is electrically connected to a second voltage supply or a third voltage supply through a selectable switching mechanism and each of said at least two second row wires is connected to a fourth voltage supply through a switching device.

8. A semiconductor structure comprising:
   multiple antifuse memory elements arranged in rows and columns, wherein each of said antifuse memory elements includes:
   a semiconductor substrate;
   an antifuse dielectric;
   a gate conductor located on and in direct contact with said antifuse dielectric;
   a first upper terminal in direct contact with said gate conductor;
   a second upper terminal in direct contact with said gate conductor and not in direct contact with said first upper terminal;
   a channel located directly underneath and in direct contact with said antifuse dielectric and located within said semiconductor substrate;
   a source in direct contact with said channel and located within said semiconductor substrate;

a drain in direct contact with said channel and not in direct contact with said source and located within said semiconductor substrate, wherein said gate conductor, said antifuse dielectric, said channel, said source, said drain, and said semiconductor substrate form a MOSFET;

a resistor that is electrically directly connected to said drain in a series connection;

at least two first row wires, each connecting said first upper terminals of said antifuse memory elements located in a same row;

at least two second row wires, each connecting said second upper terminals of said antifuse memory elements located in a same row;

at least two first column wires, each connecting said resistors in a same column, wherein one end of each of said resistors connects to said drain and the other end of each of said resistors connects to one of said at least two first column wires;

at least two second column wires, each connecting said sources in a same column; and at least two third column wires, wherein said drains in a same column are connected to one of said at least two third column wires, and each of said third column wire is connected to a sense node structure, wherein each of said at least two first column wires is connected to a first voltage supply through a first switching element in a series connection, wherein each of said at least two second column wires is connected to ground through a second switching element in a series connection, wherein each of said at least two first row wires is electrically connected to a second voltage supply or a third voltage supply through a selectable switching mechanism and each of said at least two second row wires is connected to a fourth voltage supply through a switching device.

* * * * *